United States Patent
Choi et al.

(10) Patent No.: US 11,963,301 B2
(45) Date of Patent: Apr. 16, 2024

(54) PRINTED CIRCUIT BOARD

(71) Applicant: SAMSUNG ELECTRO-MECHANICS CO., LTD., Suwon-si (KR)

(72) Inventors: Seong Ho Choi, Suwon-si (KR); Tae Seok Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/682,036

(22) Filed: Feb. 28, 2022

(65) Prior Publication Data

US 2023/0057689 A1    Feb. 23, 2023

(30) Foreign Application Priority Data

Aug. 17, 2021    (KR) .................. 10-2021-0108086

(51) Int. Cl.
    *H05K 1/11*    (2006.01)
    *H05K 1/18*    (2006.01)

(52) U.S. Cl.
    CPC ............. *H05K 1/115* (2013.01); *H05K 1/111* (2013.01); *H05K 1/181* (2013.01); *H05K 2201/09036* (2013.01)

(58) Field of Classification Search
    CPC ............. H05K 1/115; H05K 1/111; H05K 2201/09036; H05K 1/09; H05K 3/243; H05K 3/341; H05K 3/4623
    See application file for complete search history.

(56) References Cited

U.S. PATENT DOCUMENTS

| | | | | |
|---|---|---|---|---|
| 5,940,729 A | * | 8/1999 | Downes, Jr | H01L 24/83 257/773 |
| 7,977,579 B2 | * | 7/2011 | Bathan | H01L 23/4334 29/832 |
| 8,319,115 B2 | * | 11/2012 | Ohsumi | H01L 23/49811 174/262 |
| 2002/0050642 A1 | * | 5/2002 | Oota | H01L 23/3128 257/784 |
| 2009/0183901 A1 | * | 7/2009 | Kataoka | H01L 21/4846 174/257 |

(Continued)

FOREIGN PATENT DOCUMENTS

| | | | |
|---|---|---|---|
| JP | 2013093405 A | * | 5/2013 |
| JP | 2015-211083 A | | 11/2015 |

(Continued)

OTHER PUBLICATIONS

English translation (machine) of Japanese document JP2013093405A. Publication date May 2013. (Year: 2013).*

*Primary Examiner* — Ishwarbhai B Patel
(74) *Attorney, Agent, or Firm* — MORGAN, LEWIS & BOCKIUS LLP (57) ABSTRACT

A printed circuit board includes: an insulating layer; a first circuit layer disposed on one surface of the insulating layer, and including a first circuit pattern and a first connection pad; and a surface treatment layer disposed on one surface of the first connection pad. The other surface of the first connection pad is covered by the insulating layer, and at least a portion of a side surface of the first connection pad is spaced apart from the insulating layer.

20 Claims, 7 Drawing Sheets

(56) References Cited

U.S. PATENT DOCUMENTS

| | | | |
|---|---|---|---|
| 2015/0216050 A1* | 7/2015 | Kawai | H05K 3/4007 |
| | | | 174/251 |
| 2015/0311417 A1 | 10/2015 | Horikawa et al. | |
| 2016/0050752 A1* | 2/2016 | Kang | H05K 1/111 |
| | | | 174/257 |
| 2016/0064319 A1* | 3/2016 | Suzuki | H01L 23/49822 |
| | | | 174/251 |
| 2017/0317017 A1* | 11/2017 | Ishihara | H01L 23/49827 |
| 2020/0365418 A1* | 11/2020 | Sawada | H01L 21/4857 |
| 2022/0104345 A1 | 3/2022 | Yoo et al. | |

FOREIGN PATENT DOCUMENTS

| | | |
|---|---|---|
| KR | 10-2016-0026710 A | 3/2016 |
| KR | 10-2022-0042632 A | 4/2022 |

* cited by examiner

PRINTED CIRCUIT BOARD

CROSS-REFERENCE TO RELATED APPLICATION(S)

This application claims benefit of priority to Korean Patent Application No. 10-2021-0108086 filed on Aug. 17, 2021 in the Korean Intellectual Property Office, the disclosure of which is incorporated herein by reference in its entirety.

TECHNICAL FIELD

The present disclosure relates to a printed circuit board, and particularly, to a printed circuit board having a structure in which a surface treatment layer is selectively disposed on a surface of an embedded connection pad.

BACKGROUND

Currently, for a bond finger (B/F) connected to an electronic component through a wire, a surface of a copper (Cu) connection pad is plated with nickel (Ni) and gold (Au). The expansion phenomenon of the nickel and gold plating makes it difficult for the connection pad to secure a desired line width in the case of a fine pitch. In a case in which an embedded pad is derived through an embedded trace substrate (ETS) method, Ni/Au plating is performed after the pad is formed, and a Ni/Au plating layer is applied to both an upper surface and a side surface of the pad. As a result, it is difficult for a desired line width to be secured in the connection pad.

SUMMARY

An aspect of the present disclosure may provide a printed circuit board having a structure in which a metal layer for surface treatment is disposed on a connection pad.

Another aspect of the present disclosure may provide a printed circuit board having a structure in which a surface treatment layer is disposed on an upper surface of a connection pad and does not extend to a side surface thereof.

Another aspect of the present disclosure may provide a printed circuit board having a structure in which a connection pad is partially protruding and partially embedded.

According to an aspect of the present disclosure, a printed circuit board may include: an insulating layer; a first circuit layer disposed on one surface of the insulating layer, and including a first circuit pattern and a first connection pad; and a surface treatment layer disposed on one surface of the first connection pad. The other surface of the first connection pad is covered by the insulating layer, and at least a portion of a side surface of the first connection pad is spaced apart from the insulating layer.

According to another aspect of the present disclosure, a printed circuit board may include: an insulating layer having first and second regions; a connection pad at least a portion of which is embedded in one surface of the insulating layer in the first region; a circuit pattern embedded in the one surface of the insulating layer in the second region; and a surface treatment layer disposed on one surface of the connection pad. The insulating layer has a larger thickness in the second region than in the first region.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
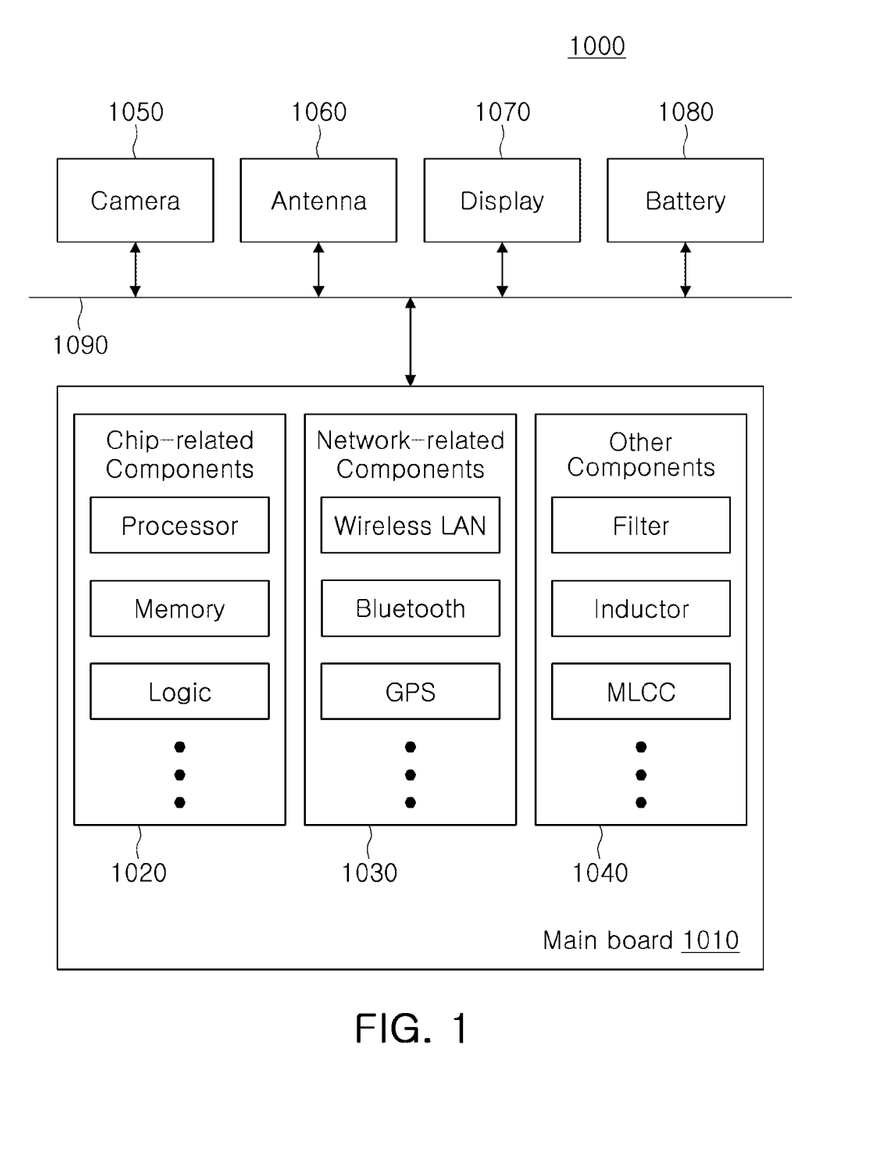
FIG. 1 is a block diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter (ADC) or an application-specific integrated circuit (ASIC). The chip-related components 1020 are not limited thereto, but may also include other types of chip-related components. In addition, these chip-related components may be combined with each other. The chip-related components 1020 may be in the form of a package including the chips described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, longterm evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with the chip-related components 1020 to be provided in a package form.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with the chip-related components 1020 and/or the network-related components 1030 to be provided in a package form.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
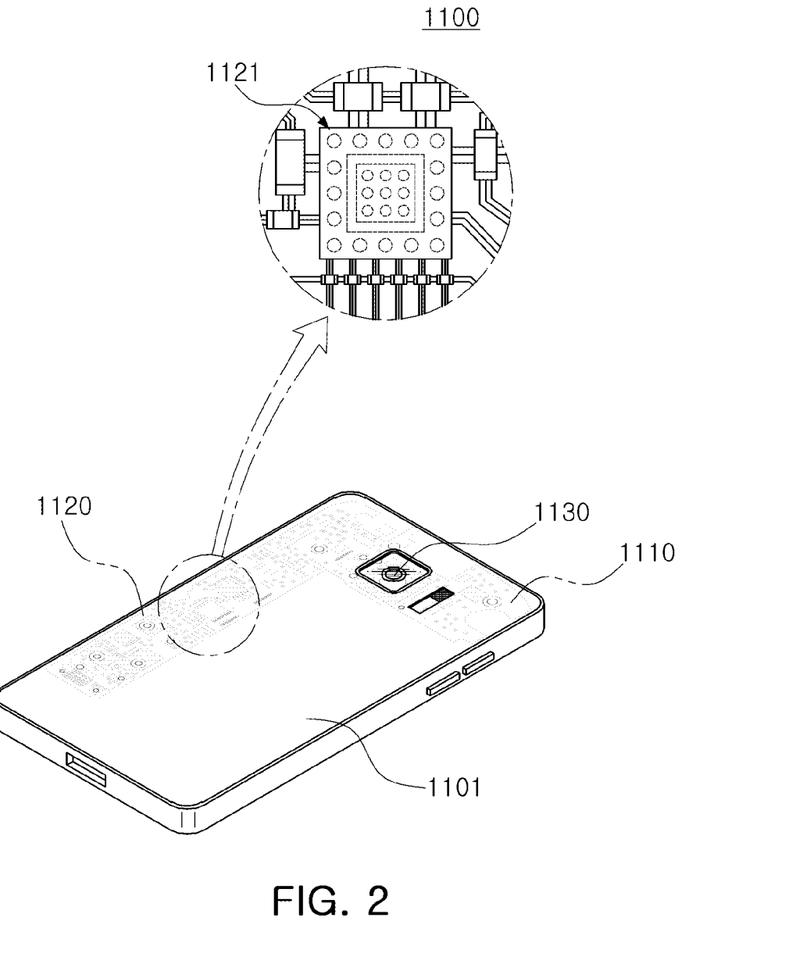
FIG. 2 is a perspective view schematically illustrating an example of an electronic device.

FIG. 2 is a perspective view schematically illustrating an example of an electronic device.

Referring to FIG. 2, the electronic device may be, for example, a smartphone 1100. A motherboard 1110 may be accommodated in the smartphone 1100, and various electronic components 1120 may be physically and/or electrically connected to the motherboard 1110. In addition, a camera module 1130, a speaker 1140, and/or the like may also be accommodated in the motherboard 1110. Some of the electronic components 1120 may be the above-described chip-related components, e.g., a printed circuit board 1121, but are not limited thereto. The printed circuit board 1121 may be in such a form that the electronic component is embedded in a multilayer printed circuit board, but is not limited thereto. Meanwhile, the electronic device is not necessarily limited to the smartphone 1100, but may be any other electronic device as described above.

Figure 3:
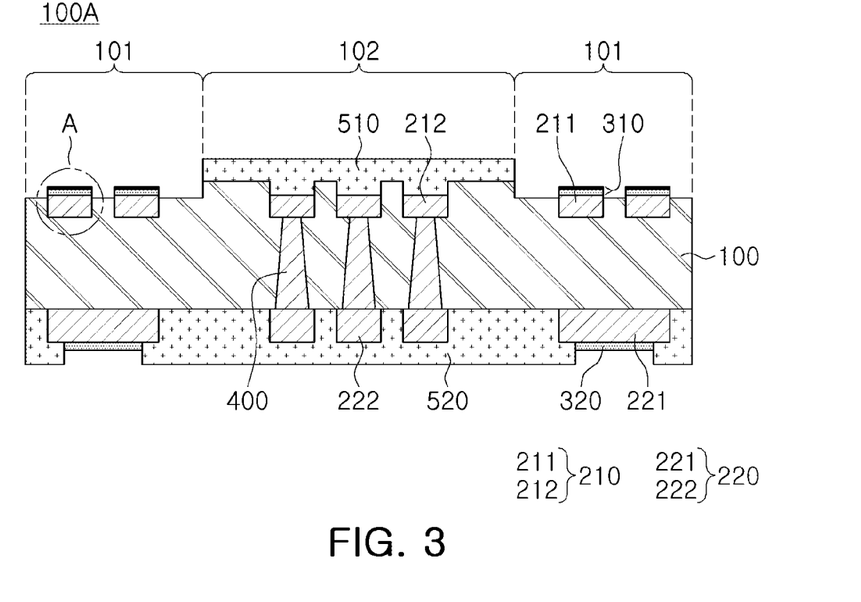
FIG. 3 is a cross-sectional view schematically illustrating an example of a printed circuit board.

FIG. 3 is a cross-sectional view schematically illustrating an example of a printed circuit board.

Referring to FIG. 3, a printed circuit board 100A according to an exemplary embodiment may include an insulating layer 100, first and second circuit layers 210 and 220 disposed on one surface and the other surface of the insulating layer 100, a via layer 400 penetrating through at least a portion of the insulating layer 100 and connecting the first and second circuit layers 210 and 220 to each other, and first and second passivation layers 510 and 520 disposed on one surface and the other surface of the insulating layer 100 to at least partially cover the first and second circuit layers 210 and 220, respectively.

Specifically, the first circuit layer 210 may be embedded in one surface of the insulating layer 100, and may include a first connection pad 211 and a first circuit pattern 212. Meanwhile, the first circuit pattern 212 may be embedded in one surface of the insulating layer 100, but a portion of the first connection pad 211 may be embedded in one surface of the insulating layer 100 while the other portion of the first connection pad 211 may protrude from one surface of the insulating layer 100. The second circuit layer 220 may be disposed to protrude from the other surface of the insulating layer 100, and may include a second connection pad 221 and a second circuit pattern 222. In addition, a first surface treatment layer 310 may be disposed on the first connection pad 211, and a second surface treatment layer 320 may be disposed on the second connection pad 221.

For example, the printed circuit board 100A according to the exemplary embodiment may have a structure in which a portion of the first connection pad 211 is embedded in one surface of the insulating layer 100, and the other portion of the first connection pad 211 protrudes from one surface of the insulating layer 100 as a result of performing processes to be described below. This makes it easy to connect the first connection pad 211 to a wire at the time of wire-bonding the first connection pad 211 with an external component such as an electronic component later.

Meanwhile, the first surface treatment layer 310 may be disposed on the first connection pad 211. As an example, the first surface treatment layer 310 may include a first layer 311 including a nickel (Ni) plating layer and a second layer 312 including a gold (Au) plating layer. As the surface treatment layer 310 including nickel/gold plating layers is disposed on the first connection pad 211 as described above, it may be easy to electrically connect the first connection pad 211 to a wire 610 including gold (Au) to be described later. In addition, it is possible to secure adhesion to another electrical connection metal including tin (Sn) or the like, as well as the wire 610, thereby easily transmitting a signal and securing reliability.

Meanwhile, the first surface treatment layer 310 may be disposed only on one surface of the first connection pad 211, without being disposed on a side surface of the first connection pad 211. In a case in which the first surface treatment layer 310 covers the side surface of the first connection pad 211 or expands to the side surface of the first connection pad 211, in order to prevent a short circuit between first connection pads 211, there may be a restriction on a line width of the first connection pad 211. According to the present disclosure, however, the first surface treatment layer 310 is not disposed on the side surface of the first connection pad 211, the line width of the first connection pad 211 may be sufficiently secured.

Meanwhile, the first connection pad 211 of the printed circuit board 100A according to the exemplary embodiment may function as a bond finger connected to an electronic component 600 mounted on the printed circuit board 100A through the wire 610. In this case, the surface of the first connection pad 211 needs to be planarized for smooth wire connection. To this end, a via may not be directly connected to the first connection pad 211. That is, the via of the via layer 400 connecting the first and second circuit layers 210 and 220 to each other may be electrically connected to the first connection pad 211 by contacting only the first circuit pattern 212 without contacting the first connection pad 211.

Meanwhile, the insulating layer 100 of the printed circuit board 100A according to the exemplary embodiment may be exposed to a blasting process. As a result, the insulating layer 100 may include first and second regions 101 and 102 that are different from each other in thickness. As an example, as illustrated in FIG. 3, the insulating layer 100 may include a first region 101 and a second region 102 that is relatively thicker than the first region 101. As a result, one surface of the insulating layer 100 may have a step at a boundary between the first and second regions 101 and 102.

Meanwhile, in the printed circuit board 100A according to the exemplary embodiment, the first connection pad 211 may be selectively disposed in the first region 101 of the insulating layer 100, and the first circuit pattern 212 may be selectively disposed in the second region 102 of the insulating layer 100.

Hereinafter, components of the printed circuit board 100A according to the exemplary embodiment will be described in more detail with reference to the drawings.

Referring to FIG. 3, the insulating layer 100 may have one surface and the other surface facing the one surface, may function as a core of the printed circuit board 100A, and may be formed by stacking a plurality of build-up insulation layers. In the insulating layer 100, a portion of the first region 101 may be removed through the blasting process after disposing the first passivation layer 510 as in processes to be described below, and accordingly, there may be a difference in thickness between the second region 102, which is not affected by the blasting process, and the first region 101. For example, as illustrated in FIG. 3, the second region 102 of the insulating layer 100 may be thicker than the first region 101 of the insulating layer 100. In the present disclosure, the thickness of the insulating layer 100 may refer to a shortest distance between one surface and the other surface of the insulating layer 100. In addition, the shortest distance between one surface and the other surface may refer to an average value of shortest distances in a plurality of sections, rather than a shortest distance in a single section, between one surface and the other surface. That is, an average value of shortest distances between one surface and the other surface of the insulating layer 100 in the first region 101 may be smaller than that in the second region 102. That is, since only the first region 101 of the insulating layer 100 is directly exposed to the blasting process, the thickness of the insulating layer 100 in the first region 101 may be smaller than that in the second region 102.

A material of the insulating layer 100 may be an insulating material, for example, a thermosetting resin such as an epoxy resin or a thermoplastic resin such as a polyimide resin. Alternatively, the material of the insulating layer 100 may be a material including an inorganic filler such as silica and a reinforcing material such as a glass fiber together with the thermosetting or thermoplastic resin. For example, the material of the insulating layer 100 may be prepreg, but is not limited thereto, and may be a material including no reinforcing material such as a glass fiber, e.g., an Ajinomoto build-up film (ABF). The ABF may be provided in the form of resin coated copper (RCC), but is not limited thereto. If necessary, the material of the insulating layer 100 may be a photosensitive material such as a photo imageable dielectric (PID). Although it is illustrated in FIG. 3 that the insulating layer 100 is formed of only one layer, the insulating layer 100 may be formed of a larger number of insulating layers depending on need and design.

The first and second circuit layers 210 and 220 may be disposed on one surface and the other surface of the insulating layer 100, respectively. Specifically, the first circuit layer 210 may be disposed such that at least a portion thereof is embedded in one surface of the insulating layer 100, and the second circuit layer 220 may be disposed on the other surface of the insulating layer 100 to protrude from the other surface of the insulating layer 100. The first circuit layer 210 may include a first connection pad 211 and a first circuit pattern 212. In this case, the first connection pad 211 may be exposed externally to function as an external connection terminal when the printed circuit board 100A is connected to another component, and the first circuit pattern 212 may be covered by the insulating layer 100 and the first passivation layer 510 to be described below. The second circuit layer 220 may include a second connection pad 221 and a second circuit pattern 222. In this case, the second connection pad 221 may be exposed externally to function as an external connection terminal when the printed circuit board 100A is connected to another component, and the second circuit pattern 222 may be covered by the insulating layer 100 and the second passivation layer 520 to be described below.

Meanwhile, the first circuit pattern 212 may be embedded in one surface of the insulating layer 100, but the first connection pad 211 may have a partially embedded/partially protruding structure in which at least a portion thereof is embedded in one surface of the insulating layer 100 and the other portion thereof protrudes from one surface of the insulating layer 100. This is a structure derived by performing a selective blasting process to be described below after disposing the first circuit layer 210. Consequently, the first connection pad 211 may protrude from the insulating layer 100 differently from the first circuit pattern 212 and the second circuit layer 220, and at least a portion of the side surface of the first connection pad 211 may be exposed externally.

A material of the first and second circuit layers 210 and 220 may be a metal material, for example, copper (Cu), aluminum (Al), silver (Ag), tin (Sn), gold (Au), nickel (Ni), lead (Pb), titanium (Ti), or an alloy thereof. The first and second connection pads 211 and 221 may function as connection terminals for electrical connection with external components. In particular, a connection pad close to a surface on which the electronic component 600 to be described below is mounted may function as a bond finger and be connected to the wire 610. The first and second circuit patterns 212 and 222 may perform various functions depending on design. For example, the first and second circuit patterns 212 and 222 may include ground patterns, power patterns, signal patterns, and the like. Each of these patterns may be in the form of a line, a plane, or a pad. Each of the first and second circuit layers 210 and 220 may be formed through a plating process such as an additive process (AP), a semi AP (SAP), a modified SAP (MSAP), or tenting (TT), and may resultantly include a seed layer, which is an electroless plating layer, and an electroplating layer formed based on the seed layer. In a case in which a partial portion of the insulating layer 100 is provided in the form of RCC, each of the first and second circuit layers 210 and 220 may further include a metal foil such as a copper foil, and a primer resin may exist on a surface of the metal foil if necessary. Each of the first and second circuit layers 210 and 220 may be formed of a larger number of circuit layers depending on need and design. In a case in which each of the first and second circuit layers 210 and 220 is formed of a larger number of circuit layers, a circuit layer disposed as an outermost layer may include a connection pad.

The first and second surface treatment layers 310 and 320 may be disposed on the first and second connection pads 211 and 221, respectively.

The first surface treatment layer 310 may be disposed on one surface of the first connection pad 211. That is, the first connection pad 211 may have a structure in which one surface thereof contacts the first surface treatment layer 310, the other surface thereof contacts the insulating layer 100, and a portion of the side surface thereof contacts the insulating layer 100 and the other portion of the side surface thereof is exposed externally. Meanwhile, the first surface treatment layer 310 may be disposed only on an upper surface, which is one surface, of the first connection pad 211, without being disposed on the side surface of the first connection pad 211, as a result of performing a process of embedding the first connection pad 211 to be described below. As the first surface treatment layer 310 is not disposed on the side surface of the first connection pad 211, a more space for disposing the first connection pad 211 may be secured, and a short circuit between the first connection pads 211 may also be prevented, and a line width of the first connection pad 211 may be sufficiently secured.

The first surface treatment layer 310 may include a first layer 311 including a nickel (Ni) plating layer and a second layer 312 including a gold (Au) plating layer. In this case, the first layer 311 may be disposed on the first connection pad 211 through plating, and then the second layer 312 may be disposed on the first layer 311 through additional plating. Meanwhile, the first surface treatment layer 310 may be an organic film formed through organic solderability preservative (OSP) treatment if necessary. The first surface treatment layer 310 disposed on the first connection pad 211 as described above may function to prevent oxidation of the first connection pad 211 and protect the surface of the first connection pad 211, and may secure reliability in electrically connecting the first connection pad 211 to the wire 610 or an electrical connection metal later.

Meanwhile, through the blasting process to be described below, a surface of the second layer 312 of the first surface treatment layer 310 may have a different roughness in a partial area thereof. That is, in the second layer 312, an upper surface of the second layer 312, which is directly affected by the blasting process, may have a greater degree of roughness than a side surface of the second layer 312, which is indirectly affected by the blasting process.

The second surface treatment layer 320 may be disposed on the second connection pad 221 exposed from the second passivation layer 520. Like the first surface treatment layer, the second surface treatment layer 320 may include a first layer including a nickel (Ni) plating layer and a second layer including a gold (Au) plating layer, or may include an organic film formed through OSP treatment.

The via layer 400 may penetrate through the insulating layer 100 to electrically connect the first and second circuit layers 210 and 220 to each other. Specifically, the via of the via layer 400 may contact the first circuit pattern 212 and the second circuit pattern 222 to electrically connect them to each other. Meanwhile, the first connection pad 211, which functions as a bond finger for wire bonding with the external electronic component 600, may not directly contact the via layer 400 to be connected thereto. Instead, the first connection pad 211 may be electrically connected to the via layer 400 in an indirect manner through the first circuit pattern 212 disposed on the same level.

A material of the via layer 400 may be a metal material, for example, copper (Cu), aluminum (Al), silver (Ag), tin (Sn), gold (Au), nickel (Ni), lead (Pb), titanium (Ti), or an alloy thereof. The via layer 400 may include signal vias, ground vias, power vias, and the like depending on design. Each of the vias of the via layer 400 may be formed by completely filling a via hole with the metal material, or may be formed by placing the metal material along a wall of the via hole. The via layer 400 may also be formed through a plating process such as AP, SAP, MSAP, or TT, and may include a seed layer, which is an electroless plating layer, and an electroplating layer formed based on the seed layer.

The via layer 400 penetrating through the insulating layer 100 may have a tapered shape in which its cross-sectional area gradually decreases from one surface to the other surface thereof. For example, the via layer 400 may have a tapered shape in which a cross-sectional area of one surface contacting the first circuit pattern 212 is smaller than that of the other surface contacting the second circuit pattern 222. Although only one via layer 400 is illustrated in FIG. 3, in a case in which the insulating layer 100 is formed of a plurality of layers as described above, a larger number of via layers 400 may also be formed depending on need and design.

The first and second passivation layers 510 and 520 may protect internal components from external physical and chemical damage. The first and second passivation layers 510 and 520 may be disposed on the outermost ones of the insulating layers 100, and may have openings exposing the first and second connection pads 211 and 221, respectively.

The first passivation layer 510 may be disposed on one surface of the insulating layer 100 of the printed circuit board 100A of FIG. 3 to cover the first circuit pattern 212 exposed from one surface of the insulating layer 100. Accordingly, the first circuit pattern 212 may not be exposed externally by the insulating layer 100 and the first passivation layer 510. In addition, the first passivation layer 510 may be disposed only on the second region 102 of the insulating layer 100, without being disposed on the first region 101 of the insulating layer 100, and may function as a mask in the blasting process to be described below. Accordingly, the first region 101 of the insulating layer 100, in which the first passivation layer 510 is not disposed, may be removed. In addition, as the first passivation layer 510 functions as a mask during the blasting process, the interface between the first and second regions 101 and 102 of the insulating layer 100 and a side surface of the first passivation layer 510 may be coplanar with each other. That is, coplanarity may be achieved between them.

The second passivation layer 520 may be disposed on the other surface of the insulating layer 100 to cover the second circuit pattern 222 while exposing at least a portion of the second connection pad 221 externally.

A material of the first and second passivation layers 510 and 520 may be an insulating material, for example, a thermosetting resin such as an epoxy resin, a thermoplastic resin such as a polyimide resin, or a material in which the thermosetting or thermoplastic resin is mixed with an inorganic filler, e.g., an ABF, but is not limited thereto, and may be a photosensitive insulating material (PID) or the like. In addition, as described above, the first and second surface treatment layers 310 and 320 may be disposed on the first and second connection pads 211 and 212 in areas exposed from the first and second passivation layers 510 and 520, respectively.

Figure 4:
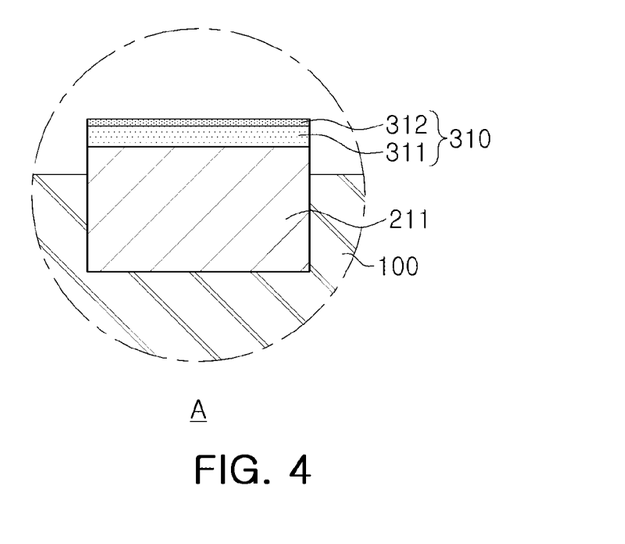
FIG. 4 is a partially enlarged view illustrating area A of the printed circuit board of FIG. 3.

FIG. 4 is a partially enlarged view illustrating area A of the printed circuit board of FIG. 3.

As illustrated in FIG. 4, the first connection pad 211 may have a structure in which at least a portion thereof is embedded into the insulating layer 100 from one surface of the insulating layer 100 and the other portion thereof protrudes from one surface of the insulating layer 100. This is a structure derived by the blasting process to be described below. The partially embedded and partially protruding structure of the first connection pad 211 makes it easy to perform a process of wire-bonding the first connection pad 211 with an external component later. As an example, if the first connection pad 211 is completely embedded in the insulating layer 100, it may be difficult to accurately match an electrical connection metal such as a wire to the first connection pad 211. In such a case, the insulating layer 100 disposed on the side surface of the first connection pad 211 may cause a failure in recognizing equipment injecting the electrical connection metal, and the equipment and the insulating layer 100 may physically collide with each other, thereby causing a defect. According to the present disclosure, however, as illustrated in FIG. 4, the first connection pad 211 may be disposed to protrude from one surface of the insulating layer 100 by a predetermined distance to prevent a defect in the process of connecting the electrical connection metal with the first connection pad 211, thereby improving a product yield, simplifying the process, and reducing a cost (F-cost).

In addition, as in processes to be described below, the first surface treatment layer 310 may be disposed in a state where the side surface of the first connection pad 211 is covered by the insulating layer 100, and then a portion of the first region 101 of the insulating layer 100 may be removed through the blasting process. Thus, the first surface treatment layer 310 may be disposed only on one surface of the first connection pad 211. That is, the first surface treatment layer 310 may be disposed on one surface of the first connection pad 211, and the other surface of the first connection pad 211 may be covered by the insulating layer 100.

Concerning the other overlapping components, what has been described above is identically applicable, and thus, the description thereof will not be repeated.

Figure 5:
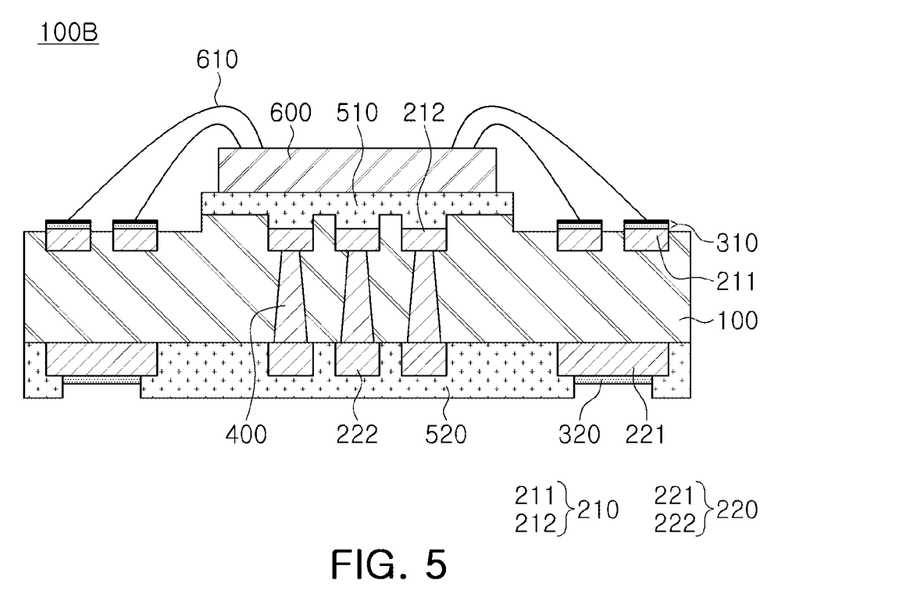
FIG. 5 is a cross-sectional view schematically illustrating a modified example of the printed circuit board of FIG. 3.

FIG. 5 is a cross-sectional view schematically illustrating a modified example of the printed circuit board of FIG. 3.

Referring to FIG. 5, in a printed circuit board 100B according to a modified example of the printed circuit board 100A according to the above-described exemplary embodiment, the electronic component 600 may be surface-mounted on one surface of the insulating layer 100 through the wire 610. Specifically, the electronic component 600 may be mounted on the first passivation layer 510, and an adhesive film such as a die attach film (DAF) may be disposed on the first passivation layer 510 in a process of mounting the electronic component 600 although not illustrated. As illustrated in FIG. 5, the electronic component 600 may be electrically connected to the first connection pad 211, which functions as a bond finger, through the wire 610. In this case, the surface treatment layer 310 disposed on the first connection pad 211 facilitates electrical connection between the first connection pad 211 and the wire 610. Meanwhile, the electronic component 600 and the first connection pad 211 may be connected to each other through an electrical connection metal such as a solder ball or a metal bump, instead of the wire 610.

Each electronic component 600 may be an integrated circuit (IC) die in which hundreds to millions of devices are integrated in a single chip. The electronic component 600 may be, for example, a processor chip such as a central processor (e.g., a CPU), a graphic processor (e.g., a GPU), a field programmable gate array (FPGA), a digital signal processor, a cryptographic processor, a micro processor, or a micro controller, specifically an application processor (AP), but is not limited thereto. In addition, the electronic component 600 may be a memory such as a volatile memory (e.g., a DRAM), a non-volatile memory (e.g., a ROM), or a flash memory, or a logic such as an analog-to-digital converter or an application-specific IC (ASIC). If necessary, the electronic component 600 may be a chip-type passive component, e.g., a chip-type capacitor such as a multilayer ceramic capacitor (MLCC) or a chip-type inductor such as a power inductor (PI). The electronic component 600 may be disposed so that a surface thereof on which a connection pad (not illustrated) is disposed faces downward, and an opposite surface thereof faces upward. The connection terminal of the electronic component 600 may include a metal material such as copper (Cu) or aluminum (Al), and may be connected to the wire 610. The wire 610 may be a conductive line including gold (Au), and may connect the connection terminal of the electronic component 600 and the first connection pad 211 to each other.

Meanwhile, the electronic component 600 and the wire 610 may be molded by an insulating film including an insulating resin (not illustrated) or an epoxy molding compound (EMC). Accordingly, the electronic component 600 and the wire 610 may be not only insulated from the outside but also protected from physical/chemical damage.

Meanwhile, although not illustrated, an additional electrical connection metal may be disposed on the other surface of the insulating layer 100 on which the electronic component 600 is not mounted. The electrical connection metal may be disposed on an exposed surface of the second connection pad 221 to connect the insulating layer 100 and the electronic component 600 to another component. The electrical connection metal may be formed of tin (Sn) or an alloy containing tin (Sn). The electrical connection metal may be, for example, a solder, but is not limited thereto, and may be a land, a ball, a pin, or the like.

Concerning the other overlapping components, what has been described above about the printed circuit board 100A according to the exemplary embodiment is identically applicable, and thus, the description thereof will not be repeated.

FIGS. 6 to 13 are cross-sectional views schematically illustrating examples of processes for manufacturing the printed circuit board of FIG. 3.

Figure 6:
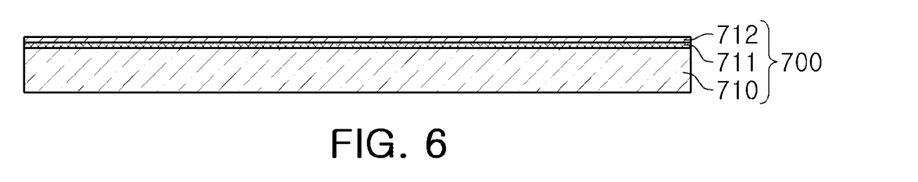
FIGS. 6 to 13 are cross-sectional views schematically illustrating examples of processes for manufacturing the printed circuit board of FIG. 3.

Referring to FIG. 6, a carrier 700 is prepared, the carrier 700 including an insulating material 710 and first and second copper foils 711 and 712 disposed on one surface of the insulating material 710. Although the subsequent cross-sectional views show one-sided build-up processes, double-sided build-up processes may be performed if necessary. In a carrier used for the double-sided build-up processes, copper foils may be disposed on both sides of the insulating material 710.

Figure 7:
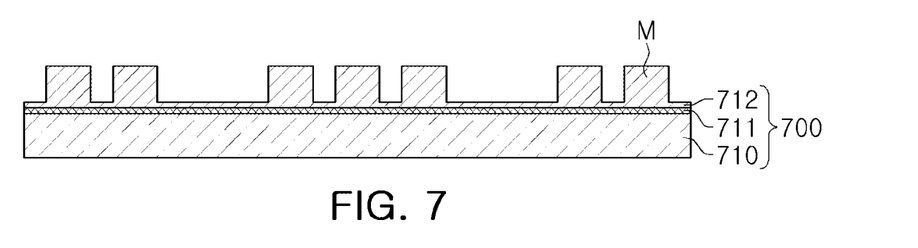

Referring to FIG. 7, a metal layer M may be disposed on the second copper foil 712 through plating and patterning processes. The metal layer M may be formed to be relatively thick in consideration of a recess depth to be generated in a process of etching the second copper foil 712 later. For example, the metal layer M may have a thickness of 16 μm, and the second copper foil 712 may have a thickness of 2 μm.

Figure 8:
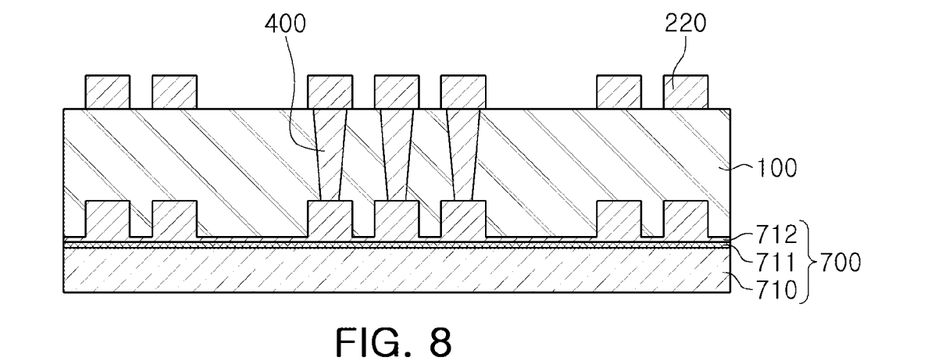

Referring to FIG. 8, the insulating layer 100, the second circuit layer 220, and the via layer 400 may be disposed through a via hole treatment process, a plating process, and a patterning process after the build-up process.

Figure 9:
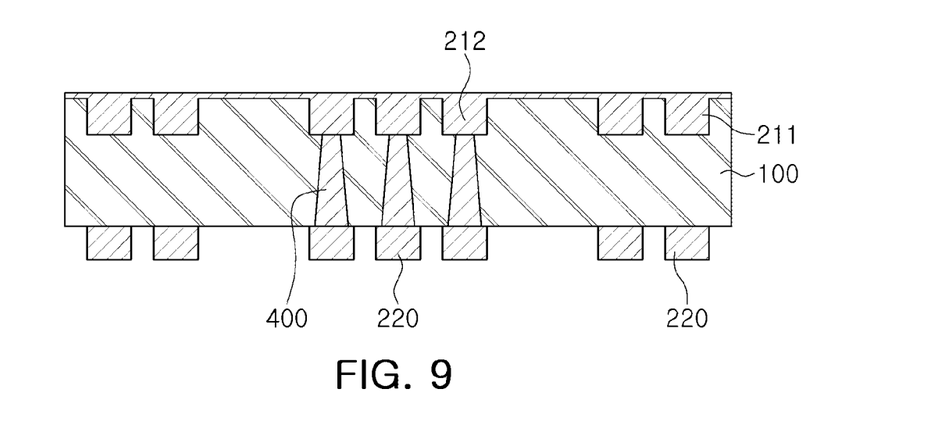

Referring to FIG. 9, the first copper foil 711 and the second copper foil 712 may be separated from each other, and a portion of the carrier 700 may be removed.

Figure 10:
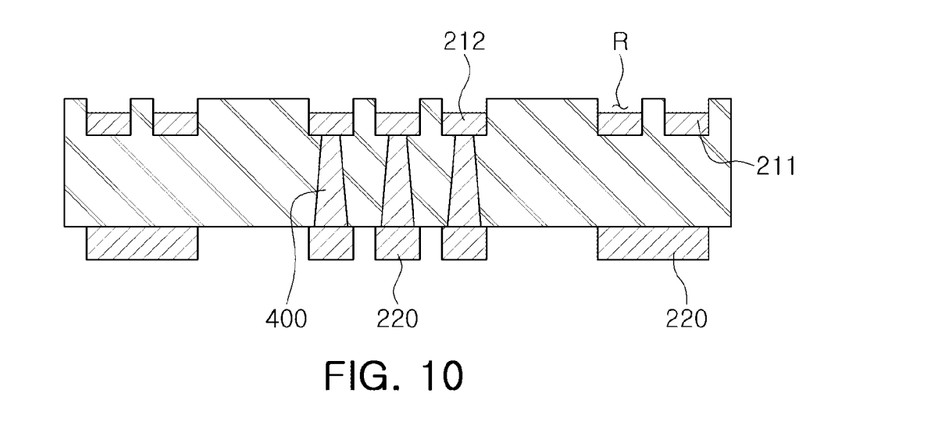

Referring to FIG. 10, the remaining second copper foil 712 may be removed through an etching process. In the process of etching the second copper foil 712, a portion of the metal layer M may also be removed together, so that a recess depth R recessed from one surface of the insulating layer 100 is formed, while the first circuit layer 210 is formed. As a non-limiting example, the recess depth R may have a height of 8 μm, and the first circuit layer 210 may have a thickness of 8 μm.

Figure 11:
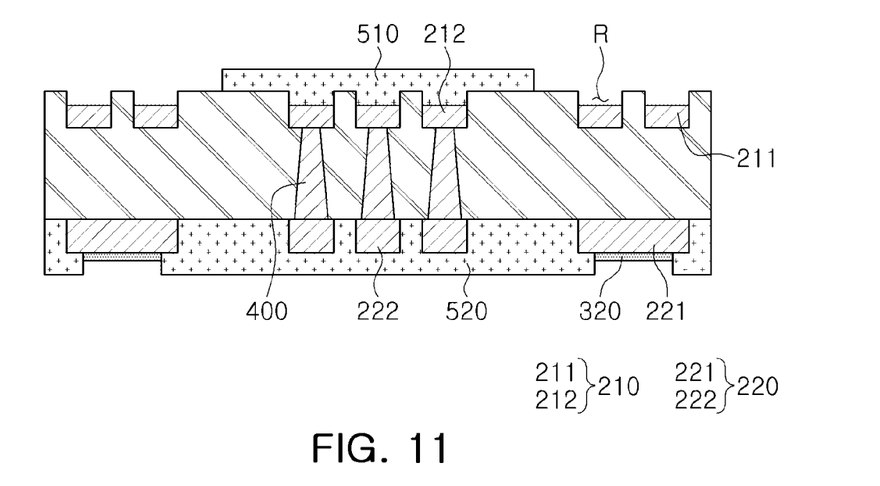

Referring to FIG. 11, the first and second passivation layers 510 and 520 may be disposed on one surface and the other surface of the insulating layer 100, respectively. The first circuit layer 210 covered by the first passivation layer 510 may be a first circuit pattern 212, and the first circuit layer 210 exposed from the first passivation layer 510 may be a first connection pad 211.

Also, the second circuit layer 220 covered by the second passivation layer 520 may be a second circuit pattern 222, and the second circuit layer 220 exposed from the second passivation layer 520 may be a second connection pad 221.

Figure 12:
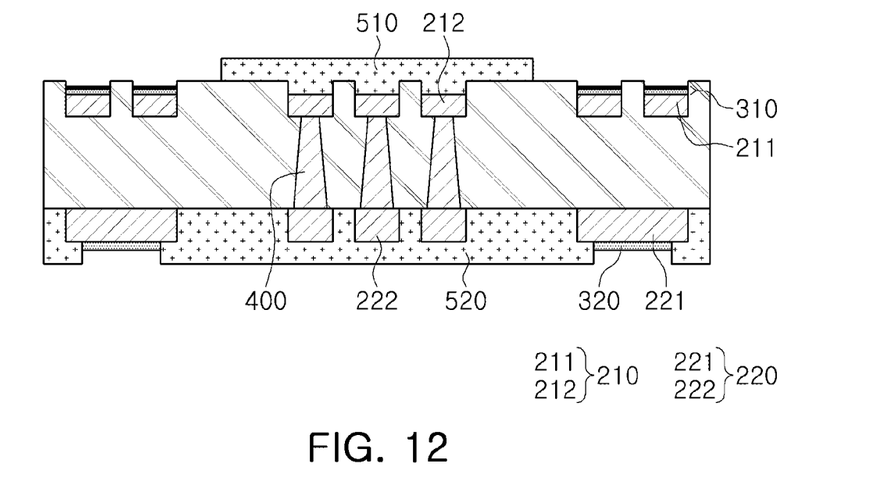

Referring to FIG. 12, the first surface treatment layer 310 may be disposed on one surface of the first connection pad 211 exposed toward one surface of the insulating layer 100 through a plating process or an organic film treatment process. When the first surface treatment layer 310 is disposed on the first connection pad 211, the side surface of the first connection pad 211 may be covered by the insulating layer 100. Thus, the first surface treatment layer 310 may not be disposed on the side surface of the first connection pad 211, and the side surface of the first connection pad 211 may be exposed externally without being covered by the first surface treatment layer 310 even though a portion of the first region 101 of the insulating layer 100 is removed through a blasting process later. As a result, it is possible to prevent a short circuit between the first connection pad 211 and another connection pad disposed adjacent to the side surface of the first connection pad 211, and it is possible to sufficiently secure a line width of the first connection pad 211.

In addition, the second surface treatment layer 320 may be disposed on the second connection pad 221 exposed from the second passivation layer 520 through a plating process or an organic film treatment process.

Figure 13:
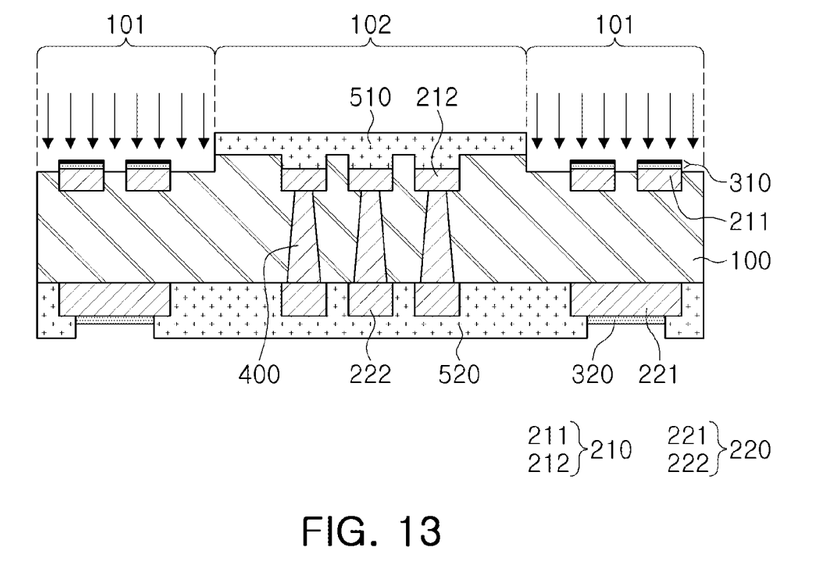

Referring to FIG. 13, a blasting process may be performed using the first passivation layer 510 as a mask. In this case, the insulating layer 100 may be divided into the first region 101, where the insulating layer 100 is exposed from the first passivation layer 510, and the second region 102, where the insulating layer 100 is covered by the first passivation layer 510. A portion of the first region 101 may be removed through the blasting process, and accordingly, at least a portion of the first connection pad 211 may protrude from one surface of the first region 101 of the insulating layer 100. Thus, at least a portion of the side surface of the first connection pad 211 may be exposed externally.

Also, as a portion of the first region 101 of the insulating layer 100 is removed through the blasting process, the first region 101 of the insulating layer 100 may have a smaller thickness than the second region 102 of the insulating layer 100 as described above. As a result, one surface of the insulating layer 100 may have a step at a boundary between the first and second regions 101 and 102.

In addition, as the first passivation layer 510 functions as a mask during the blasting process, the interface between the first and second regions 101 and 102 of the insulating layer 100 and the side surface of the first passivation layer 510 may be coplanar with each other. That is, coplanarity may be achieved between them.

In addition, the blasting process may also affect the second layer 312 of the first surface treatment layer 310. The upper surface of the second layer 312, which is directly affected by the blasting process, may have a relatively high roughness. On the other hand, the side surface of the second layer 312 exposed by removing the first region 101 of the insulating layer 100, which is indirectly affected by the blasting process, may have a relatively lower roughness than the upper surface of the second layer 312.

Concerning the other overlapping components, what has been described above about the printed circuit board 100A according to the exemplary embodiment is identically applicable, and thus, the description thereof will not be repeated.

As set forth above, as one effect of the present disclosure, it is possible to provide a printed circuit board having a structure in which a metal layer for surface treatment is disposed on a connection pad.

As another effect of the present disclosure, it is possible to provide a printed circuit board having a structure in which a surface treatment layer is disposed on an upper surface of a connection pad and does not extend to a side surface thereof.

As another effect of the present disclosure, it is possible to provide a printed circuit board having a structure in which a connection pad is partially protruding and partially embedded.

While exemplary embodiments have been shown and described above, it will be apparent to those skilled in the art that modifications and variations could be made without departing from the scope of the present invention as defined by the appended claims.

What is claimed is:

1. A printed circuit board comprising:
an insulating layer;
a first circuit layer disposed on one surface of the insulating layer, and including a first circuit pattern and a first connection pad; and
a surface treatment layer disposed on one surface of the first connection pad,
wherein the other surface of the first connection pad is covered by the insulating layer, and at least a portion of a side surface of the first connection pad is spaced apart from the insulating layer,
wherein a width of an exposed portion of the first connection pad is substantially the same as a width of portions of the first connection pad covered by the insulating layer, and
wherein a roughness of an upper surface of the surface treatment layer is greater than a roughness of a side surface of the surface treatment layer.

2. The printed circuit board of claim 1, wherein at least a portion of the first connection pad is embedded in the one surface of the insulating layer, and the other portion of the first connection pad protrudes from the one surface of the insulating layer, and
the surface treatment layer is disposed on the other portion of the first connection pad.

3. The printed circuit board of claim 2, wherein the first circuit pattern is embedded in the one surface of the insulating layer.

4. The printed circuit board of claim 1, wherein the one surface of the insulating layer has a step.

5. The printed circuit board of claim 1, wherein the surface treatment layer includes:
a first layer including nickel (Ni); and
a second layer disposed on the first layer and including gold (Au).

6. The printed circuit board of claim 5, wherein an upper surface of the second layer has a greater degree of roughness than a side surface of the second layer.

7. The printed circuit board of claim 1, further comprising a via penetrating through the insulating layer to be connected to the first circuit pattern.

8. The printed circuit board of claim 7, further comprising a second circuit layer disposed on the other surface of the insulating layer, wherein the second circuit layer is connected to the first circuit pattern through the via.

9. The printed circuit board of claim 8, wherein the via is in contact with the first circuit pattern and the second circuit layer.

10. The printed circuit board of claim 1, further comprising a first passivation layer disposed on the one surface of the insulating layer, wherein a side surface of the first circuit pattern is covered by the insulating layer, and the first passivation layer covers the first circuit pattern exposed from the one surface of the insulating layer.

11. The printed circuit board of claim 10, wherein the first passivation layer is spaced apart from the first connection pad and the surface treatment layer.

12. The printed circuit board of claim 10, further comprising an electronic component mounted on the first passivation layer.

13. The printed circuit board of claim 12, wherein the electronic component is wire-bonded with at least a portion of the first connection pad.

14. The printed circuit board of claim 1, further comprising a second passivation layer disposed on the other surface of the insulating layer and having an opening on at least a portion of the second circuit layer.

15. A printed circuit board comprising:
an insulating layer having first and second regions;
a connection pad of which at least a portion is embedded in one surface of the insulating layer in the first region, wherein a width of an exposed portion of the connection pad is substantially the same as a width of portions of the connection pad covered by the insulating layer;
a circuit pattern embedded in the one surface of the insulating layer in the second region; and
a surface treatment layer disposed on one surface of the connection pad,
wherein the insulating layer has a larger thickness in the second region than in the first region, and
wherein a roughness of an upper surface of the surface treatment layer is greater than a roughness of a side surface of the surface treatment layer.

16. The printed circuit board of claim 15, wherein the other portion of the connection pad protrudes from the one surface of the insulating layer in the first region.

17. The printed circuit board of claim 15, wherein at least a portion of a side surface of the connection pad and the other surface of the connection pad are covered by the insulating layer, and another portion of the side surface of the connection pad is spaced apart from the insulating layer.

18. The printed circuit board of claim 17, further comprising:
a passivation layer disposed on the one surface of the insulating layer in the second region to cover at least a portion of the circuit pattern.

19. The printed circuit board of claim 18, further comprising:
an electronic component mounted on the passivation layer,
wherein the electronic component is connected to the connection pad through a wire.

20. The printed circuit board of claim 15, wherein among the first region and the second region, the passivation layer is disposed only on the second region.

* * * * *